(12) United States Patent
Mi et al.

(10) Patent No.: US 7,787,639 B2
(45) Date of Patent: Aug. 31, 2010

(54) CIRCUIT FOR SUPPRESSING AUDIO NOISE

(75) Inventors: Cheng-Kuang Mi, Jhongli (TW); Shih-Yuan Wang, Bade (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 1183 days.

(21) Appl. No.: 11/399,095

(22) Filed: Apr. 5, 2006

(65) Prior Publication Data

US 2007/0154034 A1 Jul. 5, 2007

(30) Foreign Application Priority Data

Jan. 5, 2006 (TW) ............................... 95100429 A

(51) Int. Cl.
*H04B 15/00* (2006.01)
(52) U.S. Cl. .................................... 381/94.5
(58) Field of Classification Search .............. 381/94.5, 381/94.6, 94.7, 94.8, 94.1, 120, 123; 330/51, 330/297
See application file for complete search history.

(56) References Cited

U.S. PATENT DOCUMENTS

2003/0016836 A1* 1/2003 Rashid ...................... 381/94.5

* cited by examiner

*Primary Examiner*—Vivian Chin
*Assistant Examiner*—Kile Blair
(74) *Attorney, Agent, or Firm*—J.C. Patents

(57) ABSTRACT

A circuit for suppressing audio noise having a common node electrically connected to an output terminal of a preamplifier and an input terminal of a postamplifier is disclosed, in which the preamplifier is provided power by a second voltage supply. The circuit for suppressing audio noise includes a first and a second pulldown switch, a first control switch and a voltage detecting circuit. In which, the first and the second pulldown switch conduct audio noise passing the preamplifier to the ground during the early and the later stage after the second voltage supply is turned on and the voltage is stable, respectively. In addition, the voltage detecting circuit detects whether the voltage is stable or not for deciding whether the circuit for suppressing audio noise must be disabled or not. If the circuit is disabled, the audio signal directly sent to the postamplifier from the preamplifier.

11 Claims, 4 Drawing Sheets

US 7,787,639 B2

CIRCUIT FOR SUPPRESSING AUDIO NOISE

CROSS-REFERENCE TO RELATED APPLICATION

This application claims the priority benefit of Taiwan application serial no. 95100429, filed on Jan. 5, 2006. All disclosure of the Taiwan application is incorporated herein by reference.

BACKGROUND OF THE INVENTION

1. Field of Invention

The present invention relates to a circuit for suppressing audio noise, and particularly to a circuit for suppressing audio noise when the power supply is turned on and turned off.

2. Description of the Related Art

FIG. 1 is a circuit diagram of a sound system using a conventional circuit for suppressing audio noise. Referring to FIG. 1, the sound system 10 includes an audio signal generator 11, a preamplifier 12, a power amplifier 13, a speaker 14 and a circuit for suppressing audio noise 15. Wherein, the audio signal generator 11 is, for example, a microphone, CD/VCD/DVD player or an AM/FM tuner, all of which are used for generating an audio signal Audio1. The preamplifier 12 is provided power by a voltage supply V_PAMP and used for receiving and amplifying the audio signal Audio1, wherein a capacitor C3 is used for smoothing a possible excessive voltage fluctuation import from the voltage supply V_PAMP. The power amplifier 13 is provided power by another voltage supply V_PWR and used for receiving an audio signal Audio2 and increasing the load drive capability of the audio signal Audio2, so that the amplified audio signal is able to drive a speaker 14, wherein a capacitor C5 serves as the capacitor C3 for stabilizing voltage.

As the voltage supply V_PAMP is turned on and turned off, the audio signal Audio1 would be mixed with unwanted noise signal and be amplified by the preamplifier 12, so that a thunderous pop noise will explode. Therefore, a circuit for suppressing audio noise 15 is equipped between the preamplifier 12 and the power amplifier 13 for detecting and suppressing the audio noise.

FIG. 2 is a waveform diagram of an audio signal Audio2 inputted into the power amplifier 13 in FIG. 1. Referring to FIGS. 1 and 2, after the voltage supply V_PAMP are turned on, the voltage needs to take a rise duration to rise to a stable state (for example, in the stable state, the voltage maintains at 12 volts (V)). Similarly, after the voltage supply V_PAMP are turned off, the voltage needs to take a fall duration to fall to zero.

During the early stage of the voltage supply V_PAMP being turned on and the voltage being rising, a forward bias of around 0.7V is required to turn on a diode D1 and consequently a forward bias between the emitter and the base of a transistor T1 are not available, so that no current flow between the emitter and the collector of the transistor T1. At this point, the voltage at the base of another transistor T2 is zero; therefore, the audio signal Audio2 mixed with noise is directly sent to the power amplifier 13, which makes the speaker 14 to produce a thunderous pop noise shown as block 21 in FIG. 2. Normally, only after the voltage of the voltage supply V_PAMP rises to around 2.5V, the circuit for suppressing audio noise 15 is able to suppress the noise.

Similarly, during the early stage of the voltage supply V_PAMP being turned off and the voltage being falling, the emitter voltage of the transistor T1 is less than the base voltage, therefore the noise can not be effectively suppressed and the speaker 14 produces a thunderous pop noise shown as block 22 in FIG. 2. Only after the voltage of the voltage supply V_PAMP falls to such extent that the emitter voltage of the transistor T1 is larger than the base voltage, the circuit for suppressing audio noise 15 is able to suppress the noise.

SUMMARY OF THE INVENTION

An object of the present invention is to provide a circuit for suppressing audio noise used for effectively suppressing audio noise when a power supply is turned on and turned off; and the circuit for suppressing audio noise is in particular suitable for a sound system with large current, such as a plasma display (PDP).

The present invention provides a circuit for suppressing audio noise, having a common node electrically connected to an output terminal of a preamplifier and an input terminal of a postamplifier. The circuit for suppressing audio noise includes a first pulldown switch, a second pulldown switch, a first control switch and a voltage detecting circuit. Wherein, a first terminal of the first pulldown switch is electrically connected to the common node; a second terminal of the first pulldown switch is grounded; and a control terminal of the first pulldown switch is electrically connected to a first voltage supply. A first terminal of the second pulldown switch is electrically connected to the common node and a second terminal of the second pulldown switch is grounded. A first terminal of the first control switch is electrically connected to the first voltage supply and the control terminal of the first pulldown switch; a second terminal of the first control switch is electrically connected to a control terminal of the second pulldown switch; and a control terminal of the first control switch is electrically connected to a second voltage supply providing power to the preamplifier. The voltage detecting circuit is electrically connected to the control terminal of the first control switch. Wherein, the first voltage supply has the substantially same characteristic before and after the voltage thereof is stable, and the second voltage supply has the substantially same characteristic before and after the voltage thereof is stable.

During a first duration after the first voltage supply is turned on, the first pulldown switch is turned on and conducted the common node to the ground. During a second duration after the second voltage supply is turned on and the voltage thereof is stable, the first control switch is turned on to conduct the first voltage supply to control the second pulldown switch turn on and the common node is consequently grounded. After the second voltage supply is turned on and the voltage thereof is stable, the voltage detecting circuit outputs a signal to control the first control switch turn off and the second pulldown switch is consequently turned off. Wherein, the first duration and the second duration are partially overlapped; or the second duration follows right after the first duration if the first duration and the second duration are not overlapped.

In an embodiment, the voltage detecting circuit of the circuit for suppressing audio noise includes a second control switch and a Zener diode. A first terminal of the second control switch is electrically connected to the second voltage supply and the control terminal of the first control switch, while a second terminal of the second control switch is electrically connected to a signal for controlling the first control switch turn off. An anode of the Zener diode is electrically connected to a control terminal of the second control switch, while a cathode of the Zener diode is electrically connected to the second voltage supply. Wherein, the Zener diode works in the breakdown region for turning on the second control switch when the second voltage supply is turned on and the voltage thereof is stable.

According to an embodiment of the present invention, the first pulldown switch of the circuit for suppressing audio noise is a P-type MOSFET (metal oxide semiconductor field effect transistor), the first control switch is an N-type MOSFET and both of the second pulldown switch and the second control switch are NPN-type BJT (bipolar junction transistor). Besides, the postamplifier is, for example, a power amplifier.

According to the present invention, two pulldown switches are employed to bring the audio noise passing the preamplifier to the ground during the early stage and the later stage when the voltage supply is turned on and the voltage is stable, respectively. Further, the present invention uses a voltage detecting circuit to detect whether the voltage is stable or not and according to the detected result decides whether the circuit for suppressing audio noise must be disabled, so that the audio signal is delivered directly to a postamplifier from the preamplifier. In this way, the present invention is able to suppress audio noise when the power supply is turned on and turned off.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

For simplicity, the following embodiment uses a P-type MOSFET as the first pulldown switch, an N-type MOSFET as the first control switch and an NPN-type BJT as the second pulldown switch. Besides, the postamplifier takes a power amplifier as an example.

Figure 1:
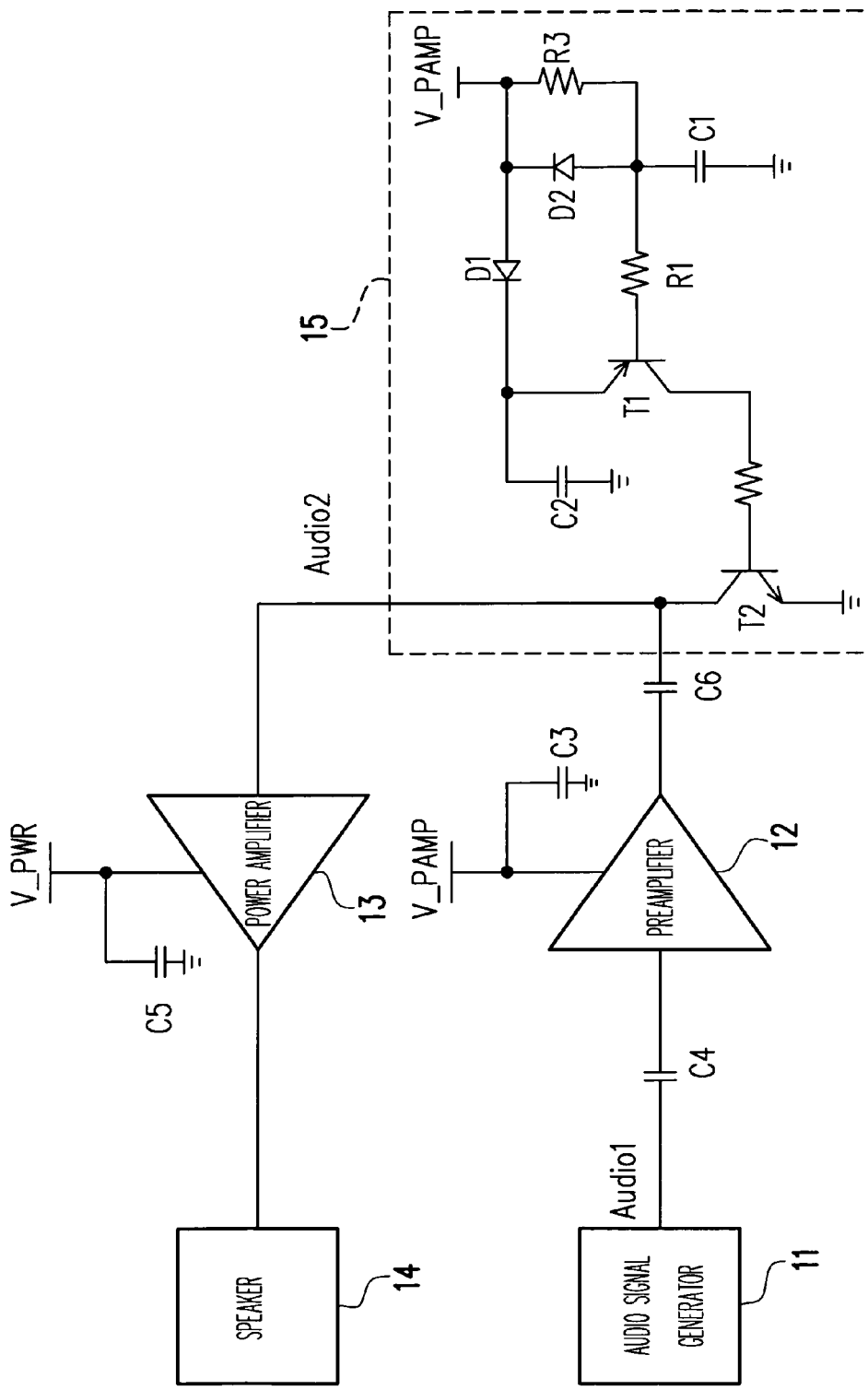
FIG. 1 is a circuit diagram of a sound system using a conventional circuit for suppressing audio noise.
Figure 2:
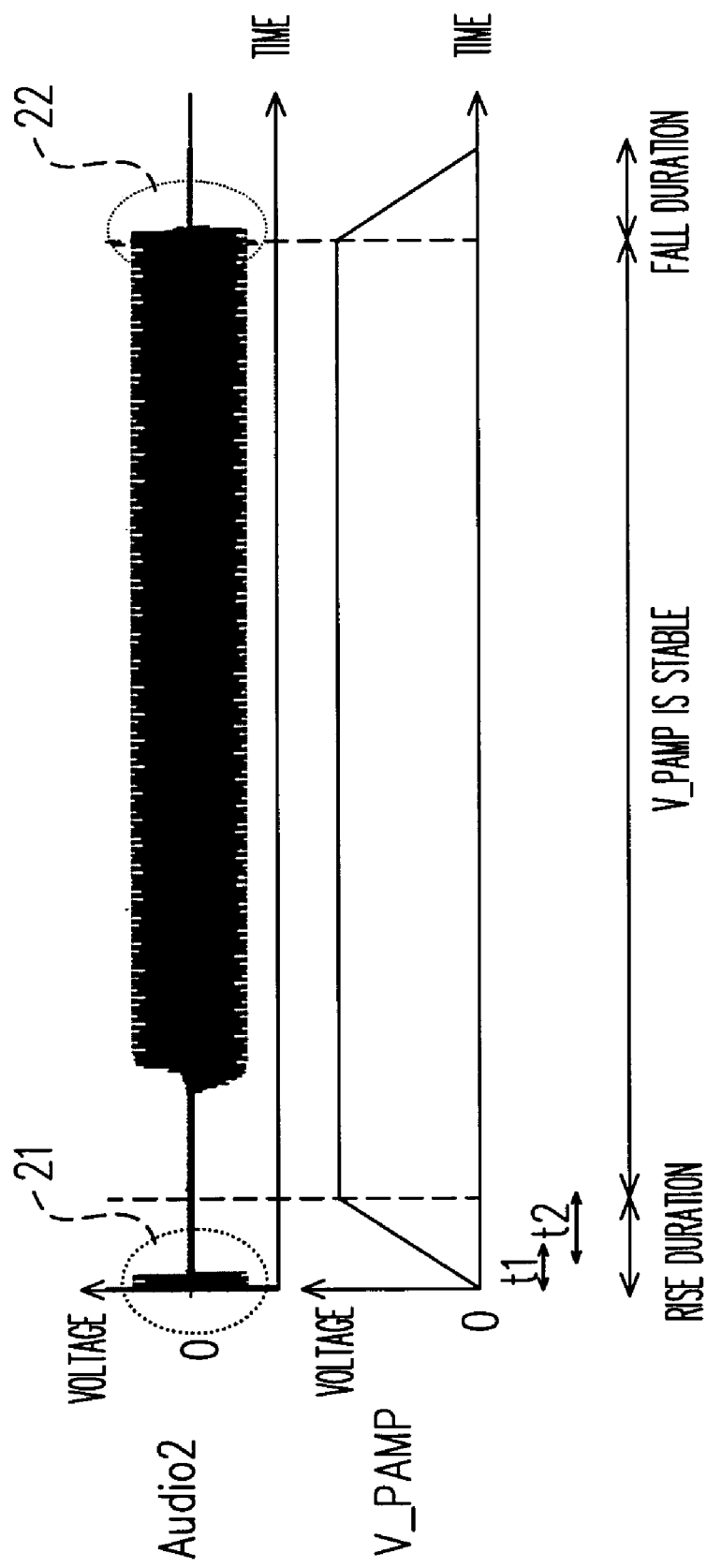
FIG. 2 is a waveform diagram of an audio signal inputted into the power amplifier in FIG. 1.
Figure 3:
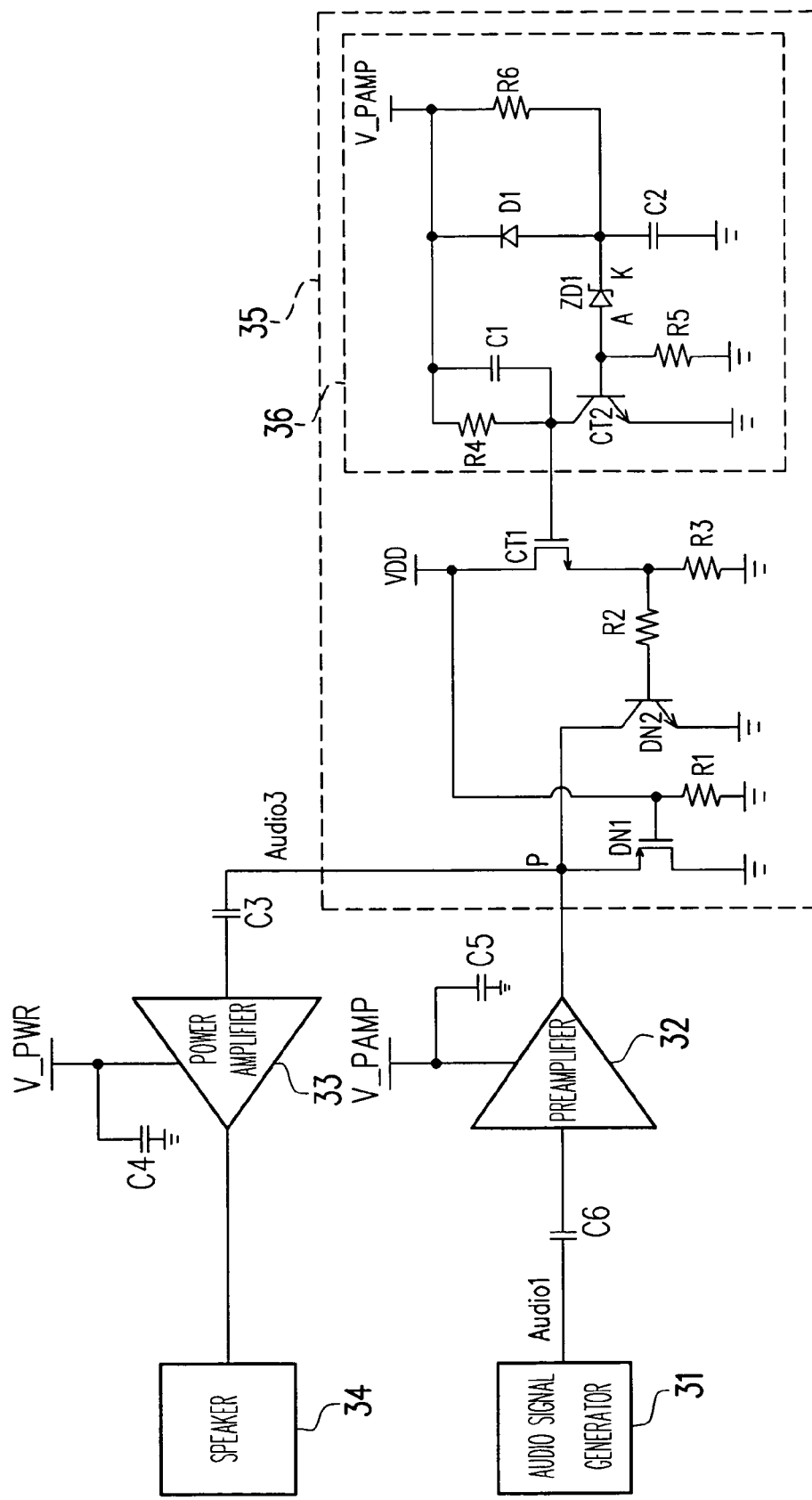
FIG. 3 is a circuit diagram of a sound system using a circuit for suppressing audio noise according to the present invention.

FIG. 3 is a circuit diagram of a sound system using a circuit for suppressing audio noise according to the present invention. Referring to FIG. 3, the sound system 30 includes an audio signal generator 31, a preamplifier 32, a power amplifier 33, a speaker 34 and a circuit for suppressing audio noise 35. Wherein, the audio signal generator 31 is, for example, a microphone, a CD/VCD/DVD player or an AM/FM tuner, used for generating audio signals Audio1. The preamplifier 32 is provided power by a second voltage supply V_PAMP and used for receiving the audio signals Audio1, wherein a capacitor C5 is disposed for avoiding an excessive voltage fluctuation at the preamplifier 32, which is outputted from the second voltage supply V_PAMP. The power amplifier 33 is provided power by a voltage supply V_PWR and used for receiving the audio signals Audio3 and amplifying the received signal to boost the capacity for driving load, i.e. driving the speaker 34, wherein a capacitor C4 serves as the capacitor C5 for stabilizing voltage, while capacitors C6 and C3 are used for filtering DC. In addition, the waveform diagram of an audio signal Audio3 inputted into the power amplifier 33 in FIG. 3 is illustrated in FIG. 4.

Figure 4:
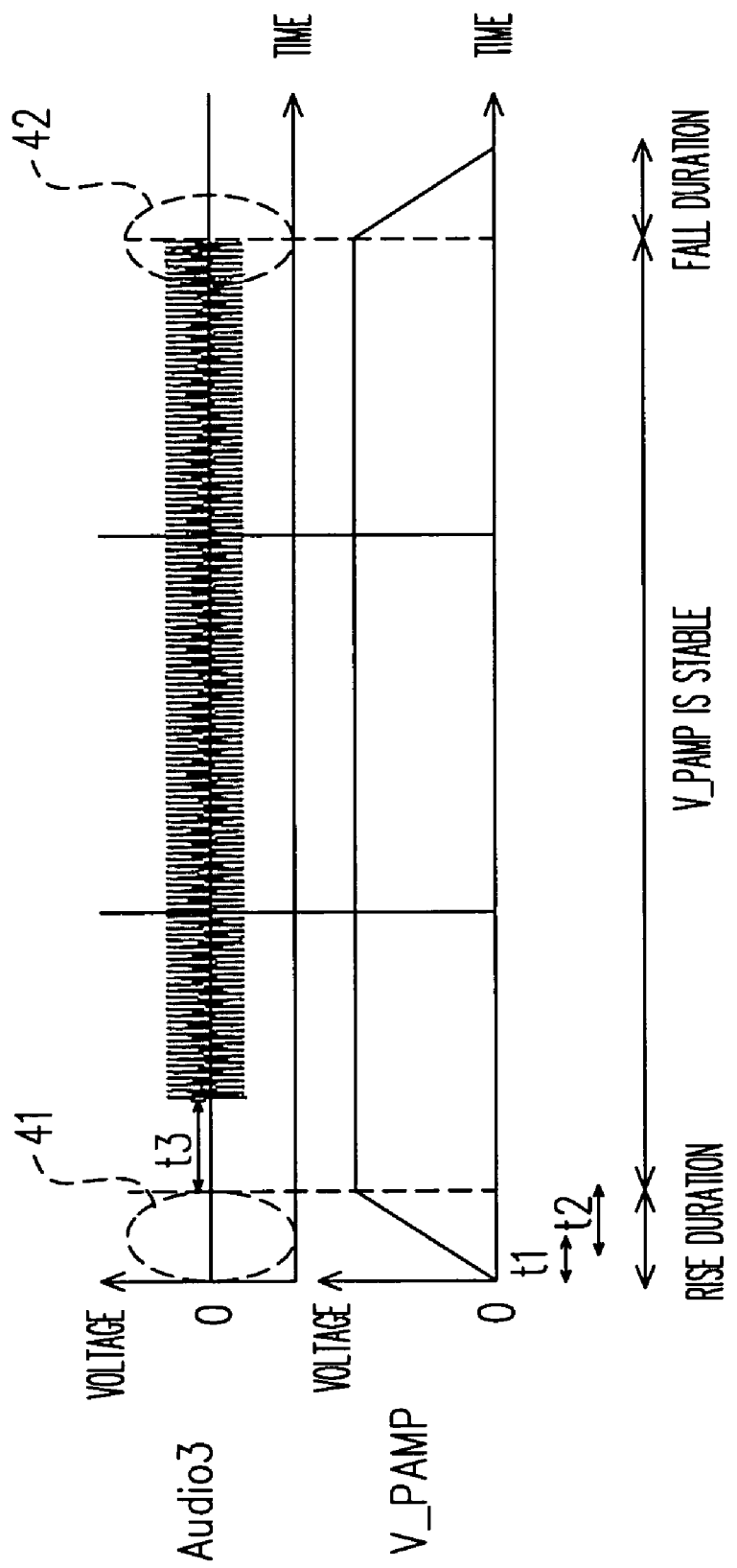
FIG. 4 is a waveform diagram of an audio signal inputted into the power amplifier in FIG. 3.

Referring to FIGS. 3 and 4, the circuit for suppressing audio noise 35 has a common node P, which is electrically connected to the output terminal of the preamplifier 32 and the input terminal of the postamplifier 33. The circuit for suppressing audio noise 35 includes a first pulldown switch DN1, a second pulldown switch DN2, a first control switch CT1 and a voltage detecting circuit 36. Wherein, the first pulldown switch DN1 is a P-type MOSFET, the second pulldown switch DN2 is an NPN-type BJT and the first control switch CT1 is an N-type MOSFET.

The first terminal (i.e. the source) of the first pulldown switch DN1 is electrically connected to the common node P; the second terminal (i.e. the drain) of the first pulldown switch DN1 is grounded; and the control terminal (i.e. the gate) of the first pulldown switch DN1 is electrically connected to a first voltage supply VDD and a first resistor R1. The first terminal (i.e. the collector) of the second pulldown switch DN2 is electrically connected to the common node P; the second terminal (i.e. the emitter) of the second pulldown switch DN2 is grounded; and the control terminal (i.e. the base) of the second pulldown switch DN2 is electrically connected to the second terminal (i.e. the source) of the first control switch CT1 through the second resistor R2 and the third resistor R3. The first terminal (i.e. the drain) of the first control switch CT1 is electrically connected to the first voltage supply VDD and the control terminal of the first pulldown switch DN1; the control terminal (i.e. the gate) of the switch CT1 is electrically connected to the second voltage supply V_PAMP through a delay circuit formed by a first capacitor C1 and a fourth resistor R4. The resistor R1 serves for protecting the switch DN1, while the resistors R2 and R3 serve for protecting the switch DN2. The electric characteristics of the first voltage supply VDD and the second voltage supply V_PAMP before and after the voltage is stable are substantially the same. In other words, the voltage rising rate and falling rate of the first voltage supply VDD are approximately the same, and so are the voltage rising rate and falling rate of the second voltage supply V_PAMP. The difference between the voltage supply VDD and the voltage supply V_PAMP is that the voltage supply VDD provides power to switches formed by transistors and is typically around 3.5V or 5V; while the voltage supply V_PAMP provides power to the preamplifier and is typically around tens of volts.

During a first duration after the first voltage supply VDD is turned on (corresponding to a first duration t1 after the second voltage supply V_PAMP is turned on), the first pulldown switch DN1 is turned on to make the common node P grounded and the audio noise passing the preamplifier 32 is accordingly brought to the ground. Wherein, the first duration t1 normally takes around a half voltage rising time of the voltage supply V_PAMP by design. During a second duration t2 after the second voltage supply V_PAMP is turned on and the voltage is stable, the first control switch CT1 is turned on and by means of the first control switch CT1 the first voltage supply VDD controls the second pulldown switch DN2 to be turned on. Meanwhile, the common node P is grounded and the audio noise passing the preamplifier 32 is accordingly brought to the ground. Herein, the second duration t2 normally takes around two third of voltage rising time of the voltage supply V_PAMP by design. It can be seen therefore that the first duration t1 and the second duration t2 are partially overlapped; during the voltage rising duration of the voltage supply V_PAMP, the audio signal Audio3 after passing the preamplifier 32 will not produce a pop noise shown as block 41 in FIG. 4. In addition, the time length of the third duration t3 in FIG. 4 depends on the delay circuit formed by the capacitor C1 and the resistor R4.

Referring to FIG. 3 again, the voltage detecting circuit 36 includes a second control switch CT2 and a Zener diode ZD1. Wherein, the first terminal (i.e. the collector) of the second control switch CT2 is electrically connected to the control terminal of the first control switch CT1 and is through the above-mentioned delay circuit electrically connected to the second voltage supply; while the second terminal (i.e. the emitter) of the second control switch CT2 is electrically connected to a signal to turn off the first control switch CT1 (for example, couple to the ground) and the control terminal (i.e. the base) of the second control switch CT2 is electrically connected to the anode A of the Zener diode ZD1 and to a fifth resistor R5. The cathode K of the Zener diode ZD1 is electrically connected to a second capacitor C2 and is electrically connected to the second voltage supply V_PAMP through a sixth resistor R6 and a diode D1 in parallel. Herein, the resistor R5 serves for protecting the switch CT2 and the capacitor C2 is used for stabilizing node voltage at the cathode K.

The breakdown voltage of the Zener diode ZD1 can be designed as the same as the stable voltage of the second voltage supply V_PAMP after the power supply is turned on. In this way, there is almost no current flowing through the Zener diode ZD1 after the second voltage supply V_PAMP has been turned on but prior to the voltage is stabilized. At this point, the second control switch CT2 is turned off and the common node P is affected by the circuit for suppressing audio noise 35. However, once the second voltage supply V_PAMP is turned on and takes a stable voltage, the Zener diode ZD1 works in the breakdown region with a flowing current, so that the second control switch CT2 is turned on and the control terminal of the first control switch CT1 is grounded. Further, the first control switch CT1 is cut off with no current flowing through the resistors R2 and R3 and the control terminal of the second pulldown switch DN2 is grounded, which turns off the second pulldown switch DN2. Furthermore, the first pulldown switch DN1 is cut off because the first voltage supply VDD electrically connected by the control terminal of the switch DN1 takes a high-level at the point. Thus, the common node P is no longer affected by the circuit for suppressing audio noise 35. In the same way, during the voltage falling duration after turning off the voltage supply V_PAMP, the common node P is affected by the circuit for suppressing audio noise 35 and the audio noise of the preamplifier 32 is suppressed shown as block 42 shown in FIG. 4. For simplicity, the process of suppressing noise is omitted.

It can be seen from the above described that two pulldown switches are employed to bring the audio noise passing the preamplifier to the ground during the early stage and the later stage when the voltage supply is turned on and the voltage is stabilized. Further, the present invention uses a voltage detecting circuit to detect whether the voltage is stable or not and according to the detected result decides whether the circuit for suppressing audio noise must be disabled, so that the audio signal is delivered directly to a postamplifier from the preamplifier. In this way, the present invention is able to suppress audio noise at the period when the power supply is turned on and turned off.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A circuit for suppressing audio noise, having a common node electrically connected to an output terminal of a preamplifier and an input terminal of a postamplifier, comprising:
    a first pulldown switch, wherein a first terminal of the first pulldown switch is electrically connected to the common node, a second terminal of the first pulldown switch is grounded and a control terminal of the first pulldown switch is electrically connected to a first voltage supply; during a first duration after the first voltage supply is turned on, the first pulldown switch is turned on and the common node is consequently grounded;
    a second pulldown switch, wherein a first terminal of the second pulldown switch is electrically connected to the common node and a second terminal of the second pulldown switch is grounded;
    a first control switch, wherein a first terminal of the first control switch is electrically connected to the first voltage supply and the control terminal of the first pulldown switch, a second terminal of the first control switch is electrically connected to a control terminal of the second pulldown switch and a control terminal of the first control switch is electrically connected to a second voltage supply providing power to the preamplifier; during a second duration before the second voltage supply is turned on and the voltage thereof is stable, the first control switch is turned on to control the second pulldown switch turn on and the common node is consequently grounded; and
    a voltage detecting circuit, electrically connected to the control terminal of the first control switch, controlling the first control switch turn off and the second pulldown switch is consequently turned off during the second voltage supply is turned on and the voltage thereof is stable;
    wherein, the first voltage supply has the substantially same characteristic before and after the voltage thereof is stable, and the second voltage supply has the substantially same characteristic before and after the voltage thereof is stable.

2. The circuit for suppressing audio noise as recited in claim 1, further comprising:
    a first resistor, wherein a terminal of the first resistor is electrically connected to the control terminal of the first pulldown switch and the first voltage supply, while another terminal of the first resistor is grounded;
    a second resistor, wherein a terminal of the second resistor is electrically connected to the control terminal of the second pulldown switch and another terminal of the second resistor is electrically connected to the second terminal of the first control switch; and
    a third resistor, wherein a terminal of the third resistor is electrically connected to the control terminal of the second pulldown switch and the second terminal of the first control switch, while another terminal of the third resistor is grounded.

3. The circuit for suppressing audio noise as recited in claim 1, wherein the first duration and the second duration are partially overlapped.

4. The circuit for suppressing audio noise as recited in claim 1, wherein the first duration and the second duration are not overlapped, but the second duration follows right after the first duration.

5. The circuit for suppressing audio noise as recited in claim 1, wherein the first pulldown switch is a P-type MOS- FET (metal oxide semiconductor field effect transistor), the first control switch is an N-type MOSFET and the second pulldown switch is an NPN-type BJT (bipolar junction transistor).

6. The circuit for suppressing audio noise as recited in claim 1, wherein the voltage detecting circuit comprises:
- a second control switch, wherein a first terminal of the second control switch is electrically connected to the second voltage supply and the control terminal of the first control switch, while a second terminal of the second control switch is electrically connected to a signal for controlling the first control switch turn off; and
- a Zener diode, wherein an anode of the Zener diode is electrically connected to a control terminal of the second control switch and a cathode of the Zener diode is electrically connected to the second voltage supply; the Zener diode works in the breakdown region for turning on the second control switch during the second voltage supply being turned on and the voltage thereof being stable.

7. The circuit for suppressing audio noise as recited in claim 6, wherein the second control switch is an NPN-type BJT.

8. The circuit for suppressing audio noise as recited in claim 6, wherein the voltage detecting circuit further comprises a delay circuit formed by a first capacitor and a fourth resistor, wherein a terminal of the first capacitor is electrically connected to a terminal of the fourth resistor and the second voltage supply, while another terminal of the first capacitor is electrically connected to another terminal of the fourth resistor and the first terminal of the second control switch.

9. The circuit for suppressing audio noise as recited in claim 6, wherein the voltage detecting circuit further comprises:
- a fifth resistor, wherein a terminal of the fifth resistor is electrically connected to the control terminal of the second control switch and the anode of the Zener diode, while another terminal of the fifth resistor is grounded; and
- a second capacitor, wherein a terminal of the second capacitor is electrically connected to the cathode of the Zener diode and the second voltage supply, while another terminal of the second capacitor is grounded.

10. The circuit for suppressing audio noise as recited in claim 6, wherein the voltage detecting circuit further comprises a sixth resistor and a diode, wherein a terminal of the sixth resistor is electrically connected to a cathode of the diode and the second voltage supply, while another terminal of the sixth resistor is electrically connected to an anode of the diode and the cathode of the Zener diode.

11. The circuit for suppressing audio noise as recited in claim 6, wherein if the first control switch is an N-type MOSFET, the second terminal of the second control switch is grounded.

* * * * *